United States Patent [19]

Ngo et al.

[11] Patent Number: 5,247,229

[45] Date of Patent: Sep. 21, 1993

[54] ADAPTIVE SCAN CONTROL HAVING HORIZONTAL SCAN LOCKED CLOCK SYSTEM

[75] Inventors: Duc Ngo, Chicago; Kishan R. Pulluru, Willowbrook; Gopal K. Srivastava, Arlington Heights, all of Ill.

[73] Assignee: Zenith Electronics Corporation, Glenview, Ill.

[21] Appl. No.: 822,476

[22] Filed: Jan. 17, 1992

[51] Int. Cl.$^5$ .................... G09G 1/04; H01J 29/70; H03L 7/00
[52] U.S. Cl. .................... 315/364; 315/387; 358/159
[58] Field of Search ............ 315/364, 370, 371, 387, 315/411; 358/153, 158, 159

[56] References Cited

U.S. PATENT DOCUMENTS

| | | | |
|---|---|---|---|
| 4,351,001 | 9/1982 | McGinn et al. | 358/158 |
| 4,510,527 | 4/1985 | den Hollander | 358/158 |
| 4,611,229 | 9/1986 | Srivastava et al. | 358/158 |
| 4,634,939 | 1/1987 | Dietz | 315/399 |
| 5,043,813 | 8/1991 | Christopher | 358/158 |

Primary Examiner—Gregory C. Issing

[57] ABSTRACT

A television receiver includes conventional systems for receiving a broadcast type signal and displaying the received signal upon a cathode ray tube. Vertical and horizontal scan system oscillators and controls produce vertical and horizontal scan signal synchronized to the reference sync signals. A scan clock system cooperates with the horizontal oscillator and control system to produce horizontal scan related signals which are synchronized to the CRT scan.

5 Claims, 2 Drawing Sheets

ADAPTIVE SCAN CONTROL HAVING HORIZONTAL SCAN LOCKED CLOCK SYSTEM

CROSS REFERENCE TO RELATED PATENT APPLICATION

This application is related to a co-pending application entitled MULTIPLE FREQUENCY RANGE OSCILLATOR AND CONTROL, Ser. No. 709,939 (Docket filed Jun. 4, 1991 which is assigned to the assignee of the present application and which is incorporated herein by reference.

FIELD OF THE INVENTION

This invention relates generally to television receivers and particularly to the display scan and display scan synchronization systems used therein.

BACKGROUND OF THE INVENTION

The television receiver has become one of the most familiar electronic communication devices throughout much of the world. Equally pervasive are the broadcast and cable systems which provide the television signals upon which these receivers are dependent. While a variety of broadcast and receiver systems are employed, the basic fundamentals of system operation remain common to virtually all television broadcast operations and television receivers. At the broadcast facility, the video or picture information together with the associated sound information is formatted in accordance with the applicable sequential display scan system to be used by the receiver. This is typically accomplished by a television camera within which a local oscillator provides periodic scan signals used by the camera to sequentially scan the image before the camera. Because the proper display of the video or picture information at the receiver requires that the receiver display be, in essence, synchronized to the scan process which was originally used in the camera, the video signal is combined with periodic scan reference signals generally referred to as synchronization signals or simply "sync" signals. The resulting signal is then modulated upon a broadcast channel carrier for distribution either through over-the-air broadcast, cable systems, or recording upon fixed media such as video cassettes.

At the television receiver, the "broadcast" signal is received and processed to recover the video, sound and scan synchronization signals for processing and application to the receiver display. The great majority of television receivers use a cathode ray tube (CRT) as a display device in which one or more electron guns are operative to produce high energy electron beams which energize a light producing phosphor screen and produce a viewable image. Proper image display requires that the electron beams from the electron guns within the cathode ray tube sequentially scan the phosphor screen in both horizontal and vertical directions in close synchronization with the reference sync signals provided within the received signal.

Thus, in a typical cathode ray tube display, the video or picture information is used to modulate the intensity of the electron beams and their resulting illumination of the display screen while the reference scan synchronization signals are used to properly time or sequence the horizontal and vertical direction scan actions of the image-producing electron beams of the electron gun. In monochrome cathode ray tube displays, a single electron gun is directed at a phosphor display screen having a single type of phosphor coating. In most color systems, however, a trio of electron guns corresponding to the primary colors of the systems are directed at a display screen having three different phosphor types arranged in a pattern which facilitates the individual stimulation of each phosphor type by its corresponding color primary electron gun.

The most common type of cathode ray tube scanning system uses electromagnetic yokes supported upon the cathode ray tube which create magnetic fields used to deflect the electron beams produced by the electron guns and accomplish horizontal and vertical scanning. In virtually all commercially available cathode ray tubes, the geometric relationship between the electron guns and the display screen or "faceplate" creates the well known pin cushion distortion and convergence errors. To overcome pin cushion and convergence errors, practitioners have provided pin cushion correction and convergence correction systems which apply additional signal components to the deflection system.

The foundation of the receiver display system is found in the vertical and horizontal scan oscillators and their respective control systems used to regenerate the display scan signals and properly synchronize them to the reference sync signals. In particular, the horizontal oscillator and its synchronizing system form a critical element in the receiver display. The horizontal scan oscillator produces output signals which are used to drive the horizontal deflection yoke of the CRT as well as the high voltage system which provides the required CRT electron beam accelerating potential. The deflection yoke and high voltage system signals are, in turn, used to produce the above-mentioned pin cushion correction and convergence correction signals. In addition, the increasing use of on-screen information displays found in television receivers creates a need for an additional signal component having a frequency which is a multiple of the horizontal scan frequency and which is properly synchronized to the scanning of the cathode ray tube.

Thus, a typical television receiver horizontal scan system requires a number of signals which ideally satisfy a complex set of interrelated criteria. For example, the horizontal scan output device requires oscillator signals precisely synchronized or locked to the incoming sync signals while the systems providing pin cushion and convergence correction require signals synchronized or locked to the actual CRT scan process. In addition, the on-screen display system also requires a horizontal scan frequency multiple signal which is synchronized or locked to the CRT scan.

Because the above systems all utilize various tuned or frequency responsive components, their relationships are largely frequency dependent. While this is not a significant problem in horizontal oscillator and control systems intended for use in a single scan frequency environment, substantial problems are raised if the system is used to satisfy a range of different horizontal scan frequencies. Because the horizontal scan frequencies used in the various television broadcast systems such as NTSC, PAL, HDTV, and nonstandard systems such as computer monitors or the like vary substantially, the maintenance of these relationships between signal components while operating in each of these environments is a difficult and complex task.

Despite these difficulties and complexities, however, there remains a need in the art for a horizontal scan control and clock system which provides the appropriate drive signals for all of the scan related functions and which accommodates a wide spectrum of scan frequencies. Accordingly, it is a general object of the present invention to provide an improved adaptive horizontal scan control. It is a more particular object of the present invention to provide an adaptive horizontal scan control having a horizontal scan locked clock system. It is a still more particular object of the present invention to provide an improved adaptive horizontal scan control and scan locked clock system which accommodates a broad spectrum of horizontal scan frequencies.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

DESCRIPTION OF THE PREFERRED EMBODIMENT

Figure 1:
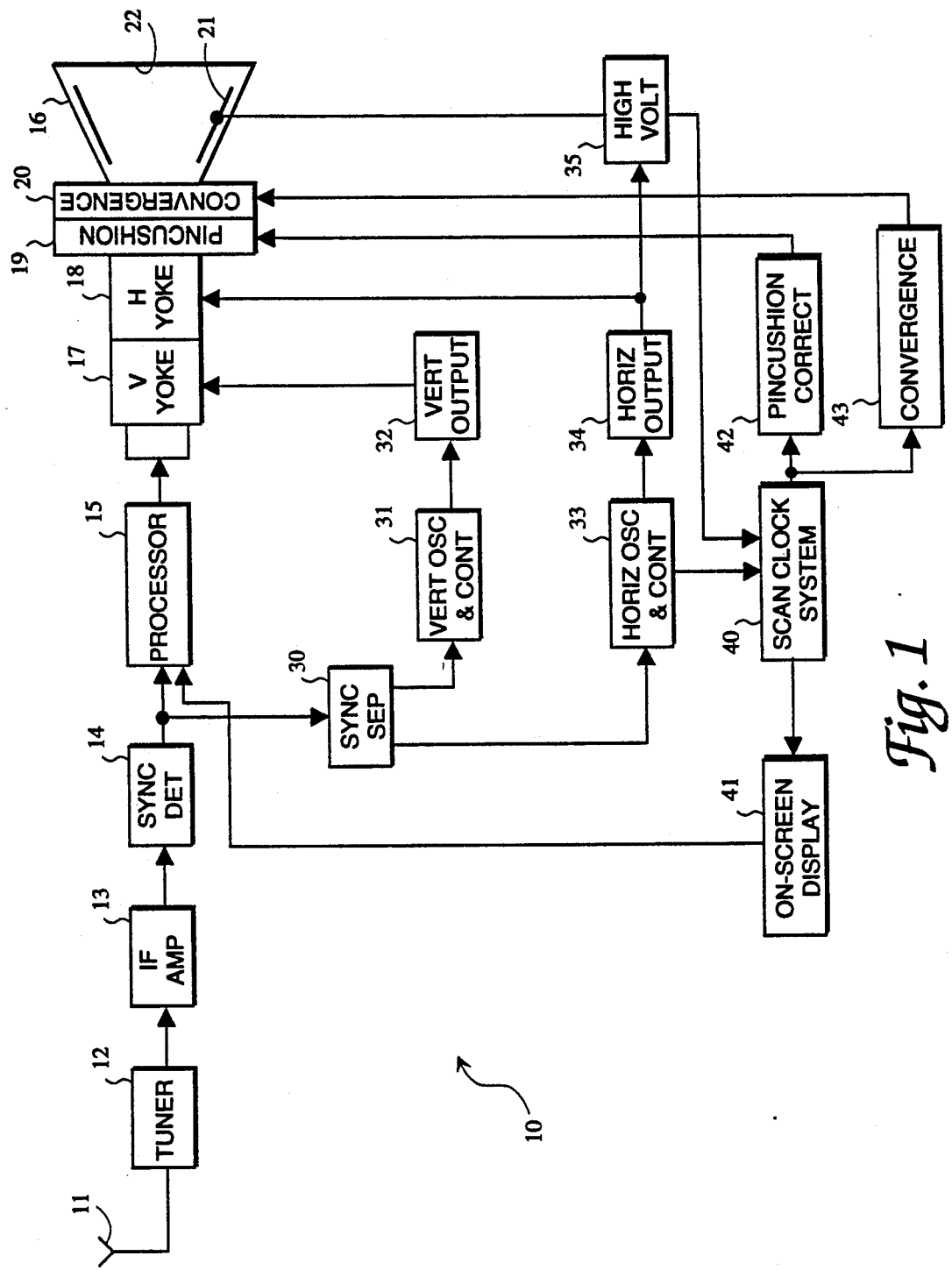
FIG. 1 sets forth a block diagram of a television receiver constructed in accordance with the present invention.

FIG. 1 sets forth a television receiver having an adaptive scan control and horizontal scan locked clock system constructed in accordance with the present invention and generally referenced by numeral 10. Receiver 10 includes an antenna 11 coupled to a tuner 12, the output of which is coupled to an intermediate frequency amplifier 13. The output of intermediate frequency amplifier 13 is coupled to a synchronous detector 14 which produces an output signal coupled to a signal processor 15. A cathode ray tube 16, constructed in accordance with conventional fabrication techniques, supports a vertical scan yoke 17 together with a horizontal scan yoke 18. A pin cushion corrector 19 and a convergence corrector 20 are also supported upon cathode ray tube 16. In further accordance with conventional fabrication techniques, cathode ray tube 16 includes a phosphor display screen 22 and an electron beam accelerating electrode 21. While not seen in FIG. 1, cathode ray tube 16 should be understood to further include a trio of electron guns which are coupled to processor 15 and which are directed toward phosphor display screen 22.

A sync separation circuit 30, constructed in accordance with conventional fabrication techniques, is coupled to the output of synchronous detector 14. A vertical oscillator and control 31 which may be constructed in accordance with conventional fabrication techniques, produces a vertical scan signal which is applied to a vertical output amplifier 32 which in turn is coupled to vertical yoke 17. A horizontal oscillator and control 33, which in its preferred form is constructed in accordance with the horizontal oscillator and control system set forth in the above-referenced related application, produces an oscillator output signal which is coupled to a horizontal output amplifier 34 which in turn is coupled to a high voltage generator 35 and horizontal yoke 18. High voltage generator 35 produces the electron beam accelerating potential required by cathode ray tube 16 which is coupled to electrode 21 therein. Sync separator 30 is coupled to vertical oscillator and control 31 and to horizontal oscillator and control 33 to provide reference synchronizing signals thereto.

A scan clock system 40, constructed in accordance with the present invention, is coupled to horizontal oscillator and control 33 and to high voltage generator 35. A pin cushion correction system 42 is coupled to the output of scan clock system 40 and produces pin cushion correction signals which are coupled to pin cushion corrector 19. Similarly, a convergence circuit 43 is coupled to the output of scan clock system 40 and produces convergence signals which are coupled to convergence corrector 20. An on-screen display system 41 which includes conventional circuitry for producing alpha and numeric characters suitable for display upon cathode ray tube 16 is coupled to processor 15. The output of scan clock system 40 is also coupled to on-screen display system 41.

In operation and by way of overview, the system shown in FIG. 1 with the exception of horizontal oscillator and control 33 and scan clock system 40 may initially be considered to function in accordance with conventional television receiver operation to receive a transmitted signal and recover the information therefrom which is then processed for application to the cathode ray tube display. Concurrently, the receiver scan oscillators produce horizontal and vertical rate scan signals which are amplified to drive vertical and horizontal yokes 17 and 18 while an appropriate high voltage potential is supplied by high voltage system 35.

Concurrently and in accordance with an important aspect of the present invention, horizontal oscillator and control 33 and scan clock system 40 cooperate to provide an additional horizontal scan related signal which is synchronized to the actual horizontal scan. This scan locked signal is utilized by pin cushion corrector 42 and convergence corrector 43 to derive the appropriate pin cushion and convergence correction signals for cathode ray tube 16. In addition, the scan locked clock signal produced by clock system 40 is utilized by on-screen display 41 to properly synchronize the application of alphanumeric characters to processor 15.

More specifically, a television broadcast signal is received by antenna 11 and coupled to tuner 12. In accordance with conventional fabrication techniques, tuner 12 performs a frequency selection upon the applied signal from antenna 11 to select the desire to-be-received broadcast channel. This selected channel is amplified and subjected to the frequency characteristics of the intermediate frequency filters of intermediate frequency amplifier 13 to provide the desired input signal for synchronous detector 14. In further accordance with conventional fabrication techniques, synchronous detector 14 recovers the picture, sound, and scan system synchronizing signals from the intermediate frequency signal and couples them to processor 15. The latter produces a plurality of picture information signals suitable for intensity modulation of the conventional electron guns within cathode ray tube 16 (not shown). In addition, the output signal of synchronous detector 14 is applied to sync signal separator 30 which, in accordance with conventional fabrication techniques, is operative to recover the vertical scan and horizontal scan synchronizing signals from the output signal of detector 14. Vertical oscillator and control 31 responds to the applied vertical scan reference signals to produce a vertical scan rate output signal which is amplified by vertical output amplifier 32 to drive vertical yoke 17 and provide the vertical rate deflection of the electron guns within cathode ray tube 16.

Concurrently, horizontal oscillator and control 33 includes a horizontal scan oscillator which is synchronized to the applied horizontal scan reference signals and produces an output signal which is phase and frequency synchronized to the reference synchronizing signal input. This horizontal scan rate signal is amplified by horizontal output amplifier 30 to drive horizontal scan yoke 18 and provide horizontal deflection of the electron guns within CRT 16. The output of horizontal amplifier 34 also drives high voltage generator 35 which, as mentioned above, produces the high voltage electron beam accelerating potential required by cathode ray tube 16. In its preferred form, high voltage generator 35 includes a conventional high voltage transformer or "flyback transformer" which in response to the input signal from horizontal output 34 produces a short duration high amplitude pulse signal. This pulse is generally referred to as the horizontal flyback pulse and is timed to the CRT scan process. In accordance with an important aspect of the present invention, a sample of this horizontal flyback pulse is coupled to one input of scan clock system 40.

In accordance with an important aspect of the present invention described below in greater detail, horizontal scan clock system 40 receives the output signal of the horizontal scan oscillator within oscillator and control 33 together with the above-mentioned sample of the horizontal flyback signal. As is described below, scan clock system 40 produces a horizontal rate output signal which is synchronized or locked to the horizontal flyback pulse signal. It should be reiterated at this point that the horizontal flyback pulse is an integral part of the scan process and thus is related directly to the timing of the actual scan processes taking place within cathode ray tube 16. As a result, the operation of scan clock system 40, in synchronism with the horizontal flyback sample, provides a horizontal scan rate signal which is synchronized or locked to the actual horizontal scan of cathode ray tube 16. Because the operations of pin cushion corrector 42 and convergence corrector 43 are maximally effective if properly timed to the horizontal scan of cathode ray tube 16, the output signal of clock system 40 provides an optimum or ideal timing signal for the generation of pin cushion and convergence correction signals. In addition, because the operation of on-screen display system 41 is similarly optimized if properly timed to the horizontal scan of cathode ray tube 16, the output signal of scan clock system 40 is also applied to on-screen display 41. As a result and in accordance with an important aspect of the present invention, pin cushion corrector 42, convergence system 43 and on-screen display system 41 are synchronized or locked directly to the horizontal scan processes of cathode ray tube 16 while horizontal oscillator and control 33 are synchronized or locked to the received scan reference signals provided by the broadcast system. By means set forth below in greater detail, horizontal oscillator and control 33 together with scan clock system 40 cooperate to simultaneously maintain both the appropriate synchronizing signal lock and scan signal lock operations described for a broad range of horizontal scan signal frequencies.

Figure 2:
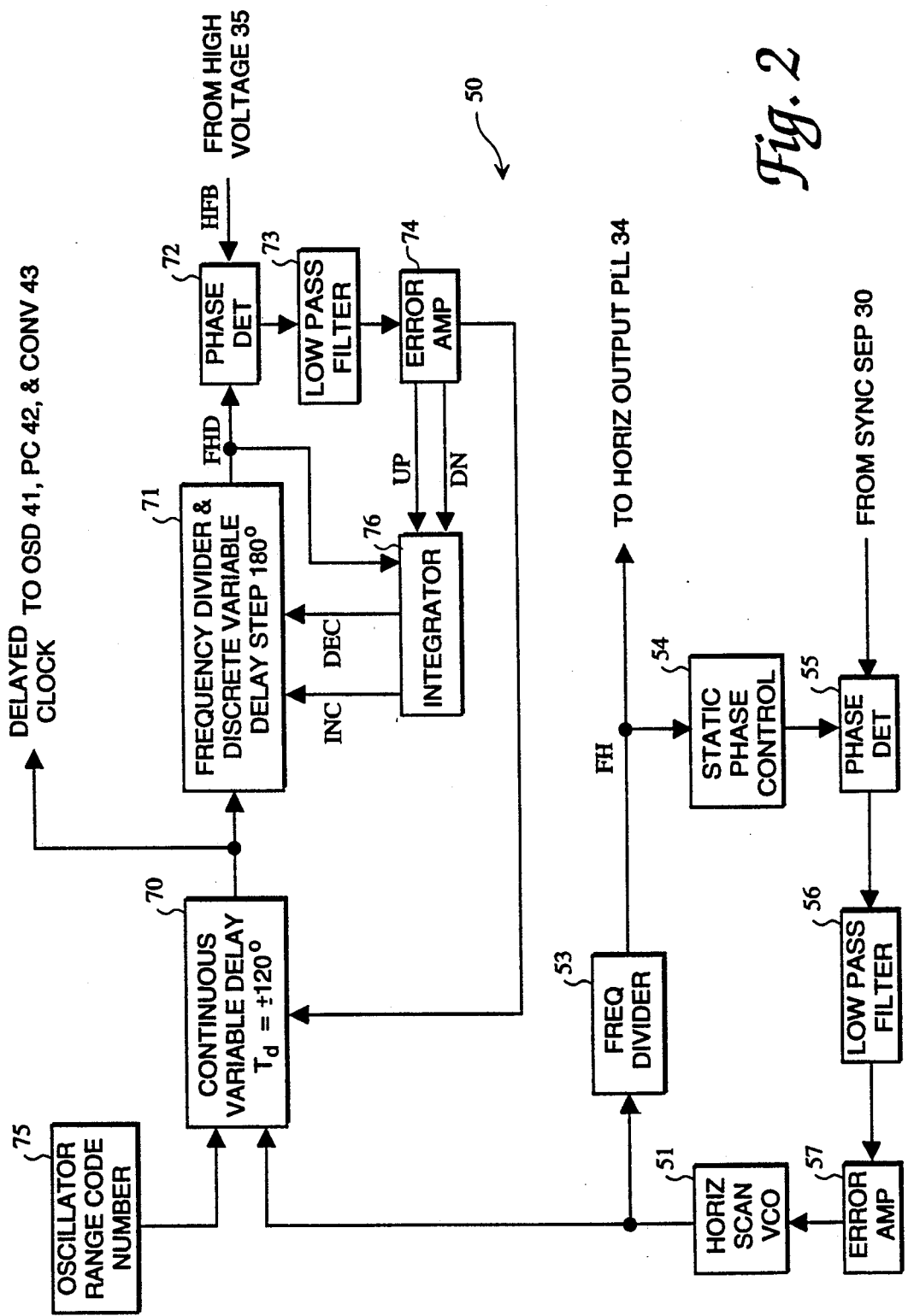
FIG. 2 sets forth a detailed block diagram of the horizontal oscillator scan control and scan locked clock system of the present invention.

FIG. 2 sets forth a block diagram of the present invention adaptive scan control and horizontal scan locked clock system generally referenced by numeral 50. A horizontal scan oscillator 51, which in its preferred form comprises a voltage controlled oscillator operating at a frequency multiple of the horizontal scan frequency is coupled to a frequency divider 53. The output of frequency divider 53 is coupled, via static phase control 54, to a phase detector 55 which is also coupled to sync separator 30 (seen in FIG. 1). The output signal of phase detector 55 is coupled to error amplifier 57 via a low pass filter 56. The output of error amplifier 57 is applied to the control input of voltage controlled oscillator 51. The output of frequency divider 53, referred to as "FH", is coupled to horizontal output amplifier 34 (seen in FIG. 1).

A continuous variable delay network 70 is coupled to the output of voltage controlled oscillator 51 and to a frequency divider and discrete variable delay network 71. An oscillator range code number source 75, which in its preferred form is constructed in accordance with the above-referenced related application, is coupled to the continuous variable delay 70. The output of the continuous variable delay is coupled to a frequency divider and discrete variable delay 71, the output of which is coupled to one input of phase detector 72, the remaining input of which is coupled to high voltage generator 35. The output of phase detector 72 is coupled to an error amplifier 74 via a low pass filter 73. The output of error amplifier 74 is coupled to continuous variable delay network 70. The outputs UP and DN of the error amplifier 74 are coupled to an integrator 76. The outputs, INC and DEC, of the integrator 76 are coupled to the frequency divider and discrete variable delay 71.

In operation and by way of overview, horizontal scan oscillator 51, frequency divider 53, phase detector 55, low pass filter 56, static phase control 54 and error amplifier 57 form a conventional phase locked loop which is operative to synchronize oscillator 51 to the horizontal scan synchronizing signals of the received broadcast signal. Static phase control 54 adjusts the horizontal display position with respect to the reference synchronizing signals and provide a sync locked drive signal for horizontal output 34 (seen in FIG. 1).

The combination of phase detector 72, low pass filter 73, error amplifier 74, continuous variable delay 70, and discrete variable delay 71 cooperate to produce an output signal which is synchronized to the horizontal flyback signal and thus is scan locked. Oscillator range code number source 75 programs programmable delay 70 to its nominal delay corresponding to the particular horizontal scan frequency for which the system is operating.

More specifically, horizontal scan oscillator 51 produces a periodic output signal having a frequency which is partially dependent upon a control signal input. In its preferred form, horizontal scan oscillator 51 is operated at a frequency multiple of the desired horizontal scan frequency. While virtually any multiple may be selected in accordance with design choice, it has been found desirable to operate the system of FIG. 2 utilizing a frequency multiple of sixty four. Thus, horizontal scan oscillator 51 produces an output signal having a frequency equal to sixty four times the desired horizontal scan rate. The oscillator range code number comprises a digitally encoded number which in accordance with the above-referenced related application corresponds to the oscillator frequency range of the desired horizontal scan signal. The output of horizontal scan voltage controlled oscillator 51 is frequency divided by divider network 53 using the same multiple (sixty four) by which the frequency of oscillator 51 is related to the desired horizontal scan. Thus, the output of frequency divider 53 corresponds to the desired horizontal scan frequency. The output of frequency divider 53 is phase adjusted by static phase control 54. Phase detector 55 compares the scan synchronizing signals provided by sync separator 30 to the output signal of static phase control 54 and produces a corresponding error signal which is filtered by low pass filter 56 and amplified by error amplifier 57. This amplified error signal is applied to the control input of horizontal scan voltage control oscillator 51 to provide the appropriate frequency correction of oscillator 51.

In accordance with an important aspect of the present invention, the output signal of horizontal scan oscillator 51 is also applied to continuous variable delay network 70 the nominal delay of which is determined in response to the output number of oscillator range code number source 75. This delay is continuously variable in response to error amplifier 74. The output of delay network 70 is frequency divided by frequency divider and discrete variable delay 71 using the same frequency multiple as frequency divider 53 (sixty four) to provide a horizontal scan rate signal FHD which is applied to one input of phase detector 72. Thus the signal FHD, one of the inputs of phase detector 72 has the same frequency as the signal HFB, the other input, which is derived from the output signal FH of the frequency divider 53. But they differ in phase. The frequency divider and discrete variable delay 71 also performs the function of a discrete variable delay. This is because its inputs, INC and DEC, can change its divisor N by half clock, to (N−½) or (N+½), per correction event. This half clock correction can be achieved by inverting the input clock of block 71. This correction continues until the signal FHD is approximately in phase with the signal HFB. Then, the signals INC and DEC disappear and the linear error signal from the error amplifier 74 modifies the fine continuous variable delay 70 to do the adjustment. As the phase of the signal HFB changes with respect to the signal FH of frequency divider 53, the error signal modifies the phase of the 64fh clock input by varying the delay of the variable delay 70 until the input signals of phase detector 72, FHD and HFB, are exactly in phase. Therefore, the delayed clock output of variable delay 70 is scan locked since the signal FHD is in phase with the signal HFB which is the retrace of the scan.

Thus, the present invention system is operative to utilize a single horizontal scan oscillator to produce the basic horizontal scan signal synchronized to the incoming reference sync as well as a horizontal scan locked signal suitable for use by the receiver's on-screen display system, pin cushion correction, and convergence correction. A finer variable delay is additionally operative in the phase control responsive to the horizontal flyback to provide the necessary phase shift from the sync locked horizontal oscillator to provide the desired scan locked signal.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. For use in a scanned display system producing a display scan signal and receiving an information signal and a periodic reference signal, a scan control comprising:
   a scan oscillator producing a scan drive signal;
   scanning means for scanning said display system in response to said scan drive signal;
   first synchronizing means responsive to said reference signal and said scan drive signal for synchronizing said scan oscillator to said reference signal; and
   second synchronizing means, coupled to said scan oscillator and said scanned display system for producing a scan-locked signal synchronized to said display scan signal, said second synchronizing means including first variable delay means, coupled to said scan oscillator, for producing a phase delayed scan drive signal having a delay responsive to a control signal input, detector means for comparing said delayed scan drive signal to said display scan signal and producing an error signal indicative of the difference therebetween, and means coupling said error signal to said control signal input of said first variable delay means.

2. A scan control as set forth in claim 1 wherein said information signal and said periodic reference signal are the video and horizontal sync signals of a television signal and wherein said first synchronizing means include a phase locked loop operative upon said scan oscillator.

3. A scan control as set forth in claim 2 wherein said display scan signal includes a short duration high amplitude retrace signal and a longer duration lower amplitude saw wave signal and wherein said detector means includes a phase detector responsive to said retrace signal.

4. A method for producing a sync-locked signal and a scan-locked signal in a scanned cathode ray tube display having a scan oscillator producing an output signal having a frequency equal to a predetermined multiple of the sync signal and means for receiving an input signal including a periodic reference sync signal, said method comprising the steps of:
   comparing the output signal of said scan oscillator divided by said predetermined multiple to said periodic reference sync signal and producing a first error signal indicative of the relationship therebetween;
   adjusting the frequency and phase of said scan oscillator in response to said first error signal to synchronize said scan oscillator to the reference sync signal and produce a sync-locked oscillator output signal;
   applying said sync-locked oscillator output signal to said cathode ray tube display to cause display system scanning responsive to said sync-locked oscillator output signal and to produce a scan signal;
   detecting the phase difference between said scan signal and said oscillator output signal;
   producing a scan-locked oscillator signal by phase adjusting a sample of said scan oscillator output signal;
   selecting a desired scan frequency from a plurality of scan frequencies which is approximately equal to the frequency of said periodic reference sync signal; and
   introducing a delay during said phase adjusting having a nominal delay interval proportional to the period of said selected scan frequency signal multiplied by said predetermined frequency multiple.

5. For use in a scanned cathode ray tube display producing an output signal having a frequency equal to a predetermined multiple of the sync signal and means for receiving an input signal including a periodic reference sync signal, scan control means for producing a sync-locked signal and a scan-locked signal comprising:

means for comparing the output signal of said scan oscillator divided by said predetermined multiple to said periodic reference sync signal and producing a first error signal indicative of the relationship therebetween;

means for adjusting the frequency and phase of said scan oscillator in response to said first error signal to synchronize said scan oscillator output signal to the reference sync signal;

means for applying the scan oscillator output signal to said cathode ray tube display to provide scanning thereof in response to said scan oscillator output signal and to produce a scan signal;

means for detecting the phase difference between said scan signal and said oscillator output signal;

means for producing a scan-locked signal by phase adjusting a sample of said scan oscillator output signal;

means for selecting a desired scan frequency from a plurality of scan frequencies which is within a predetermined frequency range of the frequency of said periodic reference sync signal; and means for introducing a delay during said phase adjusting having a delay to equal delay intervals related to the reference sync signal frequency by said predetermined frequency multiple.

* * * * *